United States Patent
Pace et al.

(10) Patent No.: US 11,319,626 B2
(45) Date of Patent: May 3, 2022

(54) APPARATUS AND METHOD FOR VACUUM DEPOSITION

(71) Applicant: ArcelorMittal, Luxembourg (LU)

(72) Inventors: Sergio Pace, Jodoigne (BE); Eric Silberberg, Haltinne (BE); Dimitri Wilders, Neupre (BE); Rémy Bonnemann, Saint-Nicolas (BE); Lucie Gaouyat, Angleur (BE)

(73) Assignee: ArcelorMittal, Luxembourg (LU)

(*) Notice: Subject to any disclaimer, the term of this patent is extended or adjusted under 35 U.S.C. 154(b) by 119 days.

(21) Appl. No.: 16/318,563

(22) PCT Filed: Jul. 27, 2017

(86) PCT No.: PCT/IB2017/000876
§ 371 (c)(1),
(2) Date: Jan. 17, 2019

(87) PCT Pub. No.: WO2018/020311
PCT Pub. Date: Feb. 1, 2018

(65) Prior Publication Data
US 2019/0242006 A1 Aug. 8, 2019

(30) Foreign Application Priority Data
Jul. 27, 2017 (WO) .................. PCT/IB2016/054477

(51) Int. Cl.
*C23C 14/24* (2006.01)
*C23C 14/02* (2006.01)
(Continued)

(52) U.S. Cl.
CPC .......... *C23C 14/246* (2013.01); *C23C 14/021* (2013.01); *C23C 14/14* (2013.01); *C23C 14/562* (2013.01)

(58) Field of Classification Search
CPC .............................. C23C 14/246; C23C 14/14
See application file for complete search history.

(56) References Cited

U.S. PATENT DOCUMENTS

| 2,665,229 A | 1/1954 | Schuler et al. |
| 5,002,837 A | 3/1991 | Shimogori et al. |
| (Continued) | | |

FOREIGN PATENT DOCUMENTS

| CN | 1348509 A | 5/2002 |
| CN | 112538604 | * 1/2006 |
| (Continued) | | |

OTHER PUBLICATIONS

CN_112538604_A_I Ren Jan. 2006 Eng translation (Year: 2006).*

*Primary Examiner* — Joseph A Miller, Jr.
(74) *Attorney, Agent, or Firm* — Davidson, Davidson & Kappel, LLC

(57) ABSTRACT

A vacuum deposition facility is provided for continuously depositing on a running substrate coatings formed from metal alloys including a main element and at least one additional element. The facility includes a vacuum deposition chamber and a substrate running through the chamber. The facility also includes a vapor jet coater, an evaporation crucible for feeding the vapor jet coater with a vapor having the main element and the at least one additional element, a recharging furnace for feeding the evaporation crucible with the main element in molten state and maintaining a constant level of liquid in the evaporation crucible, and a feeding unit being fed with the at least one additional element in solid state for feeding the evaporation crucible with the at least one additional element either in molten state, in solid state or partially in solid state. A process is also provided.

23 Claims, 1 Drawing Sheet

(51) Int. Cl.
*C23C 14/14* (2006.01)
*C23C 14/56* (2006.01)

(56) References Cited

U.S. PATENT DOCUMENTS

| | | | |
|---|---|---|---|
| 5,077,090 A * | 12/1991 | Sawyer | C23C 4/123 427/241 |
| 5,098,742 A * | 3/1992 | Inoue | C23C 14/246 427/248.1 |
| 5,195,651 A | 3/1993 | Felde et al. | |
| 6,126,760 A | 10/2000 | Oishi et al. | |
| 8,481,120 B2 | 7/2013 | Choquet et al. | |
| 2001/0022272 A1 | 9/2001 | Plester et al. | |
| 2007/0141233 A1 | 6/2007 | Schlichting et al. | |
| 2010/0104752 A1 | 4/2010 | Choquet et al. | |
| 2010/0196623 A1 | 8/2010 | Honda et al. | |
| 2011/0165326 A1 | 7/2011 | Little et al. | |
| 2011/0281031 A1 | 11/2011 | Silberberg et al. | |
| 2013/0011804 A1 | 1/2013 | Seo et al. | |
| 2013/0239890 A1 * | 9/2013 | Choquet | C23C 14/16 118/718 |
| 2014/0127406 A1 | 5/2014 | Banaszak et al. | |
| 2015/0047558 A1 | 2/2015 | Kulakovsky et al. | |

FOREIGN PATENT DOCUMENTS

| | | |
|---|---|---|
| CN | 102712994 A | 10/2012 |
| CN | 104220627 A | 12/2014 |
| EP | 2937442 A1 | 10/2015 |
| JP | H02138462 A | 5/1990 |
| JP | 4-221083 * | 8/1992 |
| JP | H06306583 | 11/1994 |
| JP | 2007169787 | 7/2007 |
| JP | 2014505794 | 3/2014 |
| RU | 2515875 C2 | 5/2014 |
| WO | 9747782 A1 | 12/1997 |
| WO | 2008142222 A1 | 11/2008 |
| WO | WO2009047879 | 4/2009 |
| WO | 2013143692 A1 | 10/2013 |
| WO | 2015067662 A1 | 5/2015 |
| WO | WO2019050377 * | 3/2019 |

* cited by examiner

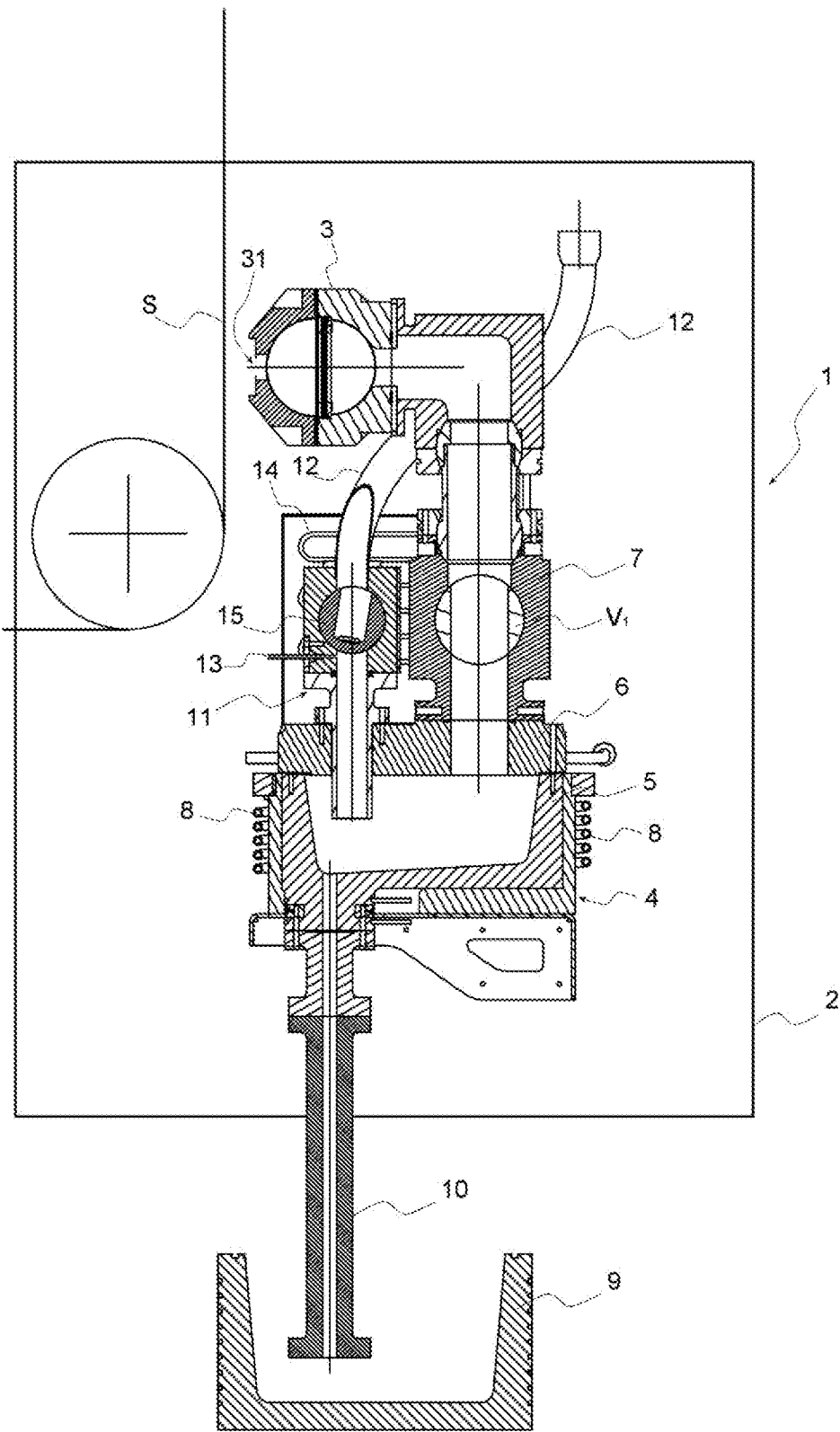

APPARATUS AND METHOD FOR VACUUM DEPOSITION

The present invention relates to a vacuum deposition facility for depositing, on a substrate, coatings formed from metal alloys such as for example zinc-magnesium alloys, said facility being more particularly intended for coating steel strip, without being limited thereto. The present invention also relates to the method for coating a substrate thereof.

BACKGROUND

Various processes for depositing metal coatings composed of alloys on a substrate, such as a steel strip, are known. Among these, mention may be made of hot-dip coating, electrodeposition and also the various vacuum deposition processes, such as vacuum evaporation and magnetron sputtering.

It is known from WO2008/142222 to deposit a metal alloy layer on a moving substrate with a vacuum deposition facility comprising a sonic vapor jet coater, an evaporation crucible suited to feed the coater with a vapor comprising the metallic elements of the coating and a recharging furnace suited to feed the evaporation crucible with the molten metal alloy by barometric effect. Such recharging furnace is convenient for producing a given coating composition. Nevertheless, as soon as variations of the coating composition are required, the height between the recharging furnace and the evaporation crucible has to be adapted. This can lead to a huge course of the recharging furnace, which is not industrially reasonable.

It is also known from EP2937442 to deposit the metal alloy layer on the moving substrate with a vacuum deposition facility comprising a vapor jet coater and an evaporation crucible fed with ingots that melt slightly above the metal alloy bath. Such feeding is constraining since two kinds of ingots are necessary: one kind at the composition of the metal alloy bath to start the facility and another kind at the composition of the metal alloy layer to compensate the evaporation at cruise power. Moreover, such ingots at a given alloy composition can be difficult to manufacture and are costly. Besides, the melting speed of the ingots limits the capability of the facility to follow line speed variations.

BRIEF SUMMARY OF THE INVENTION

An object of the present invention is therefore to remedy the drawbacks of the facilities and processes of the prior art by providing a vacuum deposition facility for depositing coatings formed from metal alloys and a process for manufacturing a substrate covered with a metal alloy layer, which allow flexibility in the management of variations in the metal alloy composition without jeopardizing the line capabilities.

The present invention provides a vacuum deposition facility for continuously depositing, on a running substrate, coatings formed from metal alloys comprising a main element and at least one additional element, the facility comprising a vacuum deposition chamber and a means for running the substrate through the chamber, wherein the facility further comprises:
- a vapor jet coater,
- an evaporation crucible suited to feed the vapor jet coater with a vapor comprising the main element and the at least one additional element,
- a recharging furnace suited to feed the evaporation crucible with the main element in molten state and capable of maintaining a constant level of liquid in the evaporation crucible,
- a feeding unit suited to be fed with the at least one additional element in solid state and suited to feed the evaporation crucible with the at least one additional element indifferently in molten state, in solid state or partially in solid state.

The facility according to the invention may also have the optional features listed below, considered individually or in combination:
- the feeding unit comprises a feeding pipe,
- the lower extremity of the feeding pipe is lower than the level of liquid in the evaporation crucible,
- the evaporation crucible comprises a cover on which the feeding pipe is connected,
- the feeding pipe comprises an ingot holder suited, on one hand, to hold the at least one additional element while it is heated up and, on the other hand, to release it in the evaporation crucible,
- the ingot holder is a valve having a U shape in cross-section,
- the feeding pipe comprises an inert gas inlet suited to provide, at least in the lower part of the feeding pipe, a pressure above the one in the evaporation crucible,
- the feeding unit comprises a preheating furnace,
- the feeding unit comprises a heating device,
- the vapor jet coater is a sonic vapor jet coater,
- the feeding of the vapor jet coater in vapor is done through an evaporation pipe connecting the evaporation crucible on the vapor jet coater,
- the recharging furnace is placed beneath the evaporation crucible and is adapted to be maintained at atmospheric pressure,
- the feeding of the evaporation crucible in main element is done through a pipe connecting the recharging furnace on the evaporation crucible,
- the evaporation crucible comprises an induction heater,
- the recharging furnace is connected to a metal ingot feed means.

The invention also provides a process for coating a substrate, comprising:
(i) feeding a metal alloy bath with a main element in molten state,
(ii) heating up at least one additional element in solid state above the metal alloy bath and feeding the metal alloy bath with the at least one additional element indifferently in molten state, in solid state or partially in solid state,
(iii) evaporating the metal alloy bath comprising the main element and the at least one additional element,
(iv) spraying the substrate, with the vapor comprising the main element and the at least one additional element, and
(v) continuously depositing a metal alloy layer comprising the main element and the at least one additional element on the substrate.

The invention further provides a process for coating a substrate, comprising:
(i) evaporating a metal alloy bath comprising a main element and at least one additional element,
(ii) spraying the substrate, with the vapor comprising the main element and the at least one additional element, and (iii) continuously depositing a metal alloy layer comprising the main element and the at least one additional element on the substrate, wherein the metal alloy bath is fed with the main element in molten state on one hand and with the at least one additional element at least partially in solid state on the other hand.

Both processes according to the invention may also have the optional features listed below, considered individually or in combination:

the vapor is sprayed on the substrate at a sonic velocity,
the metal alloy bath is continuously fed with the main element,
the continuous feeding is done by barometric effect,
the oxides possibly present at the surface of the at least one additional element are removed before heating the at least one additional element above the metal alloy bath,
the oxide removal is done by chemical pickling,
the metal alloy bath is discontinuously fed with the at least one additional element,
the at least one additional element is in the form of ingots,
the metal alloy bath is maintained at a constant composition over time by controlling the size of the ingots and/or the feeding frequency,
the metal alloy bath is continuously fed with the at least one additional element,
the at least one additional element is in the form of a wire,
the metal alloy bath is maintained at a constant composition over time by controlling the diameter of the wire and/or the feed speed,
the at least one additional element has a lower density than the main element,
the main element is zinc,
the at least one additional element is magnesium,
the process comprises continuously depositing a layer of a zinc-based metal alloy having a magnesium content by weight between 0.1% and 20% on said substrate by evaporating a bath of a zinc-based metal alloy having a magnesium content by weight between 8% and 43%.

As it is apparent, the invention is based on the double feeding of the evaporation crucible through the feeding of the main element of the metal alloy on one hand and the feeding of the additional element(s) of the metal alloy on the other hand. In particular, the invention takes advantage:

of the feeding in molten state to feed continuously the evaporation crucible with the main element and, in the same time,
of a very flexible feeding in additional element(s) based on ingots or wires that can be indifferently kept solid or partially melted or fully melted.

Thanks to this double feeding, it is possible to very easily modify the composition of the metal alloy bath, and thus of the metal alloy layer, by adjusting the feeding frequency of the additional element(s) and/or by adjusting the nature of the additional element(s). Moreover, thanks to the capacity of the recharging furnace and its ability to feed continuously the evaporation crucible, rapid variations of the line speed are possible.

Other characteristics and advantages of the invention will be described in greater detail in the following description.

BRIEF DESCRIPTION OF THE DRAWING

A preferred embodiment of the present invention will be elucidated with reference to the FIGURE which shows a cross-section of a facility according to the invention.

DETAILED DESCRIPTION OF THE DRAWING

The invention will be better understood by reading the following description, which is provided purely for purposes of explanation and is in no way intended to be restrictive, with reference to FIG. 1, which is a cross-section of an embodiment of a facility according to the invention.

It should be noted that the terms "lower", "beneath", . . . as used herein refer to the positions and orientations of the different constituent elements of the facility when the latter is installed on a vacuum deposition line.

An object of the present invention is to deposit, on a substrate, coatings formed from metal alloys comprising a main element and at least one additional element. The object is in particular to obtain zinc-magnesium coatings. However, the process is not limited to these coatings, but preferably encompasses any coating based on a metal alloy whose elements have vapor pressures at the bath temperature not differing by more than 10%, as controlling their respective relative content is then facilitated.

To give an indication, mention may thus be made of coatings made of zinc, as main element, and additional element(s), such as chromium, nickel, titanium, manganese, magnesium, silicon and aluminum, considered individually or in combination.

Moreover, although binary metal alloys are preferably targeted, it goes without saying that the deposition of ternary metal alloys, such as Zn Mg Al, or even the deposition of quaternary alloys, such as for example Zn Mg Al Si, is also possible.

The metal alloy layer will preferably comprise at least 50% by weight of main element, and more preferably, at least 80%. In the case of zinc-magnesium deposition, the metal alloy layer will preferably comprise between 0.1 and 20% by weight of magnesium. Below 0.1%, the improvement in the resistance to corrosion provided by the magnesium is no longer sufficient. Above 20%, on the other hand, the higher proportion of magnesium would result in an excessively rapid consumption of the metal alloy layer and therefore in paradoxically degraded anti-corrosion performance. In a preferred embodiment, the metal alloy layer contains at least 0.4% by weight of magnesium, preferably at least 2%. In another preferred embodiment, the metal alloy layer contains less than 15% by weight of magnesium. These preferred magnesium contents offer better compromises in terms of corrosion resistance and flexibility of the layer.

It goes without saying that either the main element or the additional element can comprise unavoidable impurities resulting from the manufacturing of raw materials used to feed the vacuum deposition facility. Even if the invention intends to avoid the contamination of the metal alloy bath by these impurities, the presence of impurities in the metal alloy layer cannot be excluded.

The thickness of the coating will preferably be between 0.1 and 20 On one hand, below 0.1 there would be a risk that the corrosion protection of the substrate would be insufficient. On the other hand, it is unnecessary to go beyond 20 µm in order to have the level of corrosion resistance which is required, in particular, in the automotive or construction field. In general, the thickness may be limited to 5 µm for automotive applications.

With reference to the FIGURE, the facility 1 according to the invention first comprises a vacuum deposition chamber 2 and a means for running the substrate through the chamber.

This deposition chamber 2 is a hermetically-sealable box preferably kept at a pressure of between $10^{-8}$ and $10^{-3}$ bar.

It has an entry lock and an exit lock between which a substrate S, such as for example a steel strip, can run.

The substrate S may be made to run by any suitable means, depending on the nature and the shape of said substrate. A rotary support roller on which a steel strip can bear may in particular be used.

In the deposition chamber 2, beside the face of the substrate S which has to be coated, there is a vapor jet coater 3. This coater is suited to spray a metal alloy vapor onto the running substrate S. It can advantageously include an extraction chamber provided with a narrow vapor outlet orifice 31, the length of which is close to the width of the substrate to be coated. This chamber may for example be made of graphite.

The vapor outlet orifice 31 may have any suitable shape, such as a slot that can be adjusted lengthwise and widthwise for example. The possibility of adapting its width makes it possible for the vapor jet to be maintained within a wide range of evaporated metal surface temperatures and therefore a wide range of evaporation rates. Furthermore, the possibility of adapting its length to the width of the substrate to be coated makes it possible to minimize the loss of evaporated metal.

The coater is preferably a sonic vapor jet coater, that is to say a coater capable of generating a vapor jet of sonic velocity. This type of coater is also usually referred to as a JVD (Jet Vapor Deposition) device. The reader may refer to the patent application WO97/47782 for a fuller description of the details of this type of device.

The vapor jet coater 3 is mounted, directly or not, on an evaporation crucible 4 suited to feed the vapor jet coater with a vapor comprising the main element and the additional element(s). The evaporation crucible 4 is suited to contain the metal alloy bath generating the vapor to be deposited on the substrate S. The evaporation crucible 4 is preferably located in the deposition chamber 2.

The evaporation crucible 4 mainly includes a pot 5, a cover 6 and an evaporation pipe 7 connected on one side on the cover and on the other side on the vapor jet coater 3. These different parts may for example be made of graphite.

The evaporation crucible 4 is provided with heating means, for example, a heater 8 enabling the metal alloy vapor to form and to feed the vapor jet coater 3. The evaporation crucible 4 is advantageously provided with an induction heater which has the advantage of making the stirring and the composition homogenization of the metal alloy bath easier.

The pressure in the evaporation crucible 4 depends on the bath temperature and on the metal alloy bath composition. It generally varies between $10^{-3}$ and $10^4$ bar. Accordingly, the pressure in the deposition chamber 2 is kept below the one in the evaporation crucible. As an example, for a Zn—Mg bath at 700° C., the pressure in the evaporation crucible is around $5.10^{-2}$ bar and the pressure in the deposition chamber is kept at around $10^{-4}$ bar. Thanks to the pressure difference created between the closed evaporation crucible and the deposition chamber, it is possible to generate the metal alloy vapor and to convey it to the vapor jet coater 3 via the evaporation pipe 7. The latter is advantageously provided with a valve $V_1$ for regulating the vapor flow rate.

The evaporation crucible 4 is connected to a recharging furnace 9 suited to feed the evaporation crucible with the main element of the metal alloy in molten state. The recharging furnace is preferably located outside of the vacuum deposition chamber 2.

The recharging furnace 9 is a pot adapted to melt the main element and to keep it in molten state thanks to a heating system. Advantageously, the recharging furnace is itself connected to a metal ingot feed means, for example, a feeder.

The feeding of the evaporation crucible 4 in main element is preferably done through a pipe 10 connecting the recharging furnace 9 on the evaporation crucible 4. The pipe inlet is adapted to plunge in the main element bath so that impurities present at the surface of the bath are not sucked up in the evaporation crucible. The pipe outlet is preferably located in the lower part of the evaporation crucible to avoid disturbing the bath surface where evaporation takes place.

The recharging furnace 9 is preferably placed beneath the evaporation crucible 4 and adapted to be maintained at atmospheric pressure. Due to the height between the evaporation crucible 4 and the recharging furnace 9 and to the pressure difference created between them, the molten main element goes up in the evaporation crucible by barometric effect as the metal alloy bath evaporates. This ensures a continuous feeding of the evaporation crucible and contributes to maintaining a constant level of liquid in the evaporation crucible, whatever the line speed.

In one embodiment of the invention, the height between the evaporation crucible 4 and the recharging furnace 9 can be adjusted to adjust the level of liquid in the evaporation crucible.

The evaporation crucible 4 is also connected to a feeding unit 11 suited to be fed with the additional element(s) in solid state, for example as ingots or as wire, and suited to feed the evaporation crucible with the additional element(s) indifferently in molten state, in solid state or partially in solid state.

Thanks to the feeding of the feeding unit 11 with additional element(s) in solid state, the feeding frequency and the dimensions of the solid element(s) are easily controlled, which allows maintaining a constant composition of the bath over time. When appropriate, it also allows modifying very easily the composition of the metal alloy bath.

The feeding unit 11 preferably comprises a feeding pipe 12 connected on the evaporation crucible 4, and preferably on the cover 6 of the evaporation crucible to take advantage of gravity.

The feeding pipe 12 can be made of different pieces and different materials. For example, a lower piece can be in graphite to resist the temperature of the evaporation crucible and an upper piece can be in a less resisting material such as metal.

The feeding of the feeding unit 11 with the additional element(s) in solid state is easily done through the upper extremity of the feeding pipe 12. To remove any water adsorbed on the surface of the additional element(s), the upper extremity of the feeding pipe 12 is preferably connected to a preheating furnace, which is part of the feeding unit. The preheating furnace is itself preferably connected to a vacuum lock arrangement.

The lower extremity of the feeding pipe 12 is preferably lower than the level of liquid in the evaporation crucible 4. The rise of vapor in the feeding pipe can thus be limited as it will be explained in more details later on.

The lower part of the feeding pipe 12 is preferably equipped with a heating device 14, eventually shared with the heating device surrounding the evaporation pipe 7. As a consequence, the additional element(s) can be heated up before their release in the metal alloy bath. Depending on the temperature in the lower part of the feeding pipe and on the residence time of the additional element(s) in the lower part of the feeding pipe, the additional element(s) are kept solid or are partially molten or are fully molten. Thanks to this flexibility in the state of the additional element(s) at the exit of the feeding unit, one can take advantage of one or the other state depending on his preferences:

if limiting the temperature difference between the additional element(s) and the metal alloy bath is preferred, so that the bath is not cooled when the additional element(s) are introduced in the bath, and so that the deposition rate is not lowered, the additional element(s) will be advantageously molten, if one prefers to avoid the deposit of additional element(s) on the internal surface of the feeding pipe, the additional element(s) will be advantageously warmed up to be at a temperature close to the bath temperature but maintained in solid state, if a compromise is needed, the additional element(s) will be advantageously partially molten.

The feeding pipe 12 advantageously comprises an inert gas inlet 13, preferably located in its lower half. Thanks to this inlet, a pressure of inert gas above the pressure in the evaporation crucible 4 can be provided in the feeding pipe. As a consequence, the rise of vapor in the feeding pipe is avoided.

In the case of ingot feeding, the feeding pipe 12 advantageously comprises an ingot holder 15 suited, on one hand, to hold an ingot of additional element(s) while it is heated up and, on the other hand, to release the additional element(s) in the evaporation crucible. The ingot holder 15 is preferably located in the lower half of the feeding pipe, at the level of the heating device 14. Thanks to this ingot holder, it is possible to efficiently control the residence time of the ingots in the feeding unit and, consequently, their temperature and state. It also makes possible to precisely control the release frequency of the ingots in the evaporation crucible.

The ingot holder 15 is preferably a valve. It has advantageously a U shape in cross-section to easily hold and release the ingot. The bottom part of the U can advantageously be covered with a shock absorber so that the ingots falling in the valve do not break it.

One skilled in the art will know how to adjust the shape of the feeding pipe 12 so that ingots are not stuck in it and do not fall violently in the evaporation crucible or in the ingot holder 15.

In the case of wire feeding, one skilled in the art will know how to adjust the shape of the feeding pipe to the diameter of the wire so that the wire is simply put under vacuum by pressure loss. One will also know how to adjust the speed of the wire to control the residence time of the wire in the feeding unit and, consequently, its temperature and state.

It has to be noted that several feeding units can be connected to the evaporation crucible, so as to feed independently several additional elements.

When it is desired to operate the facility 1, ingots of the main element are introduced into the recharging furnace 9.

Once the ingots have melted, the evaporation crucible 4 and the pipe 10 are heated and then a vacuum is created in the evaporation crucible 4. The liquid main element contained in the recharging furnace 9 then fills the evaporation crucible 4.

The composition of the metal alloy that it is desired to deposit on the substrate is firstly determined and then the composition of the bath for obtaining, in equilibrium with this bath, a vapor having the composition of the intended coating is determined. For example, a layer of a zinc-based metal alloy having a magnesium content by weight between 0.1% and 20%, respectively between 0.4 and 15%, can be obtained by evaporating a bath of a zinc-based metal alloy having a magnesium content by weight between 8% and 43%, respectively between 10% and 38%.

Accordingly, appropriate quantities of additional element(s) in solid state are introduced into the feeding unit 11 located above the metal alloy bath. They are heated up in the vicinity of the bath so as to reach a temperature close to the bath temperature. During this heating, the additional element(s) are kept solid or are partially molten or are fully molten. They are then released in the metal alloy bath where they mix with the main element.

It is then possible to:
(i) evaporate the metal alloy bath comprising the main element and the additional element(s),
(ii) spray the substrate with the vapor comprising the main element and the additional element(s), and
(iii) continuously deposit a metal alloy layer comprising the main element and the additional element(s) on the substrate.

To compensate the evaporation during operation and to maintain a constant composition of the bath, appropriate quantities of additional element(s) are added, continuously or not, to the metal alloy bath as the latter is recharged in the main element through the recharging furnace 9.

The additional element(s) are preferably added to the evaporation crucible 4 at least partially in solid state to limit the deposit of additional element(s) on the internal surface of the feeding pipe.

When the additional element(s) are of lower density than the main element, the released additional element(s) float on the surface of the metal alloy bath at the lower extremity of the feeding pipe 12 and, when appropriate, melt there. This creates a kind of cap in additional element(s) in the lower part of the feeding pipe located between its lower extremity and the level of liquid metal. Thanks to this cap, the rise of vapor in the main element is limited in the feeding pipe. Moreover, if the additional element(s) comprise impurities, the latter are kept in the cap and do not pollute the metal alloy bath. In the meantime, thanks to the feeding in additional element(s), the latter are released from the lower extremity of the feeding pipe in the evaporation crucible.

An appropriate control of
the size of the ingots in additional element(s) and/or of the feeding frequency, or the diameter of the wire in additional element(s) and/or of the feed speed, allows maintaining a constant composition of the bath over time.

To limit the level of impurities in the evaporation crucible, the additional element(s) in solid state can optionally be cleaned, before introduction in the feeding unit. The removal of oxides possibly present at the surface of the ingots/wire can notably be done by chemical pickling.

The process according to the invention applies more particularly, but not solely, to the treatment of metal strips, whether precoated or bare. Of course, the process according to the invention may be employed for any coated or uncoated substrate, such as for example aluminum strip, glass strip or ceramic strip.

The process will more particularly be applied to substrates liable to suffer a deterioration in their properties during a diffusion heat treatment, such as bake-hardening steel strip that contains large amounts of carbon in solid solution, which must not precipitate before the steel has been formed by drawing or any other suitable process. By implementing the process according to the invention it thus makes it possible to make metal alloy deposition compatible with most metallurgies.

What is claimed is:

1. A method for coating a substrate, comprising the steps of:
    feeding a metal alloy bath with a main element in a molten state;
    heating at least one additional element in solid state above the metal alloy bath and feeding the metal alloy bath with the at least one additional element either in a molten state, a solid state or a partially solid state from above the metal alloy bath;
    evaporating the metal alloy bath including the main element and the at least one additional element, thereby supplying a deposition chamber with a vapor including the main element and the at least one additional element by barometric effect;
    spraying a substrate with the vapor; and
    continuously depositing a metal alloy layer including the main element and the at least one additional element on the substrate.

2. The method for coating a substrate as recited in claim 1, wherein the at least one additional element is fed to the metal alloy bath in at least a partially solid state.

3. The method as recited in claim 1, wherein the vapor is sprayed on the substrate at a sonic velocity.

4. The method as recited in claim 1, wherein the metal alloy bath is continuously fed with the main element.

5. The method as recited in claim 4, wherein the continuous feeding of the main element to the metal alloy bath is done by barometric effect.

6. The method as recited in claim 1, further comprising the step of:
    removing oxides present on a surface of the at least one additional element before heating the at least one additional element above the metal alloy bath.

7. The method as recited in claim 6, wherein removing oxides is done by chemical pickling.

8. The method as recited in claim 1, wherein the metal alloy bath is discontinuously fed with the at least one additional element.

9. The method as recited in claim 8, wherein the at least one additional element is in a form of ingots.

10. The method as recited in claim 8, wherein the metal alloy bath is maintained at a constant composition over time by controlling a size of ingots or a feeding frequency.

11. The method as recited in claim 1, wherein the metal alloy bath is continuously fed with the at least one additional element.

12. The method as recited in claim 11, wherein the at least one additional element is in a form of a wire.

13. The method as recited in claim 12, wherein the metal alloy bath is maintained at a constant composition over time by controlling a diameter of the wire or a feed speed.

14. The method as recited in claim 1, wherein the at least one additional element has a lower density than the main element.

15. The method as recited in claim 1, wherein the main element is zinc.

16. The method as recited in claim 15, wherein the at least one additional element is magnesium.

17. The method as recited in claim 16, wherein the metal alloy bath is a zinc-based metal alloy bath having a magnesium content by weight between 8% and 43% and wherein the metal alloy layer continuously deposited on the substrate includes a magnesium content by weight between 0.1% and 20%.

18. A method for coating a substrate comprising the steps of:
    evaporating a metal alloy bath including a main element and at least one additional element, thereby supplying a deposition chamber with a vapor including the main element and the at least one additional element by barometric effect;
    spraying the substrate with the vapor; and
    continuously depositing a metal alloy layer including the main element and the at least one additional element on the substrate, the metal alloy bath being fed with the main element in a molten state and with the at least one additional element in an at least partially solid state from above the metal alloy bath.

19. The method as recited in claim 18, wherein the metal alloy bath is fed with the main element by barometric effect.

20. The method as recited in claim 18, wherein the main element and the at least one additional element have vapor pressures at the bath temperature not differing by more than 10%.

21. The method as recited in claim 16, wherein a pressure in the evaporation crucible of around $5.10^{-2}$ bar and the pressure in the deposition chamber of around $10^{-4}$ bar are maintained when the metal alloy bath is at 700° C.

22. The method as recited in claim 1, further comprising modifying a composition of the metal alloy bath by adjusting a feeding frequency of the at least one additional element.

23. The method as recited in claim 1, further comprising modifying a composition of the metal alloy bath by adjusting a quantity of the at least one additional element.

* * * * *